United States Patent
Liao

(10) Patent No.: US 6,239,978 B1
(45) Date of Patent: May 29, 2001

(54) CIRCUIT BOARD SUPPORT

(75) Inventor: Nien-Chiang Liao, Lu-Chou (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/428,293

(22) Filed: Oct. 27, 1999

(30) Foreign Application Priority Data

Mar. 16, 1999 (TW) .................................. 88203909

(51) Int. Cl.[7] .............................. H05K 5/02; H05K 5/04; H05K 7/00; H05K 7/12
(52) U.S. Cl. .................. 361/756; 361/752; 361/759; 361/748; 361/747; 361/736; 361/728
(58) Field of Search ........................... 361/679, 683–686, 361/724, 725, 726, 727, 728, 729, 730–732, 736, 740, 741, 747, 748, 752, 754, 756, 759

(56) References Cited

U.S. PATENT DOCUMENTS

| | | | |
|---|---|---|---|
| 3,838,777 | * 10/1974 | Thoricroft et al. ................. | 211/41 |
| 3,853,379 | 12/1974 | Goodman et al. ............ | 339/75 MP |
| 4,223,973 | 9/1980 | Tamburro ........................ | 339/186 M |
| 4,688,131 | * 8/1987 | Noda et al. ........................ | 360/137 |
| 4,896,777 | * 1/1990 | Lewis .................................. | 211/41 |
| 4,914,552 | 4/1990 | Kecmer ............................. | 361/415 |
| 4,964,017 | 10/1990 | Jindrick et al. .................. | 361/390 |
| 5,130,887 | * 7/1992 | Treford ............................. | 361/380 |
| 5,224,019 | 6/1993 | Wong et al. ...................... | 361/393 |
| 5,262,923 | * 11/1993 | Batta et al. ....................... | 361/685 |
| 5,319,519 | * 6/1994 | Sheppard et al. ................ | 361/685 |
| 5,406,453 | * 4/1995 | Cusato et al. ..................... | 361/733 |
| 5,682,291 | * 10/1997 | Jeffries et al. .................... | 361/1.85 |
| 5,683,159 | 11/1997 | Johnson ............................ | 312/334.7 |
| 5,816,673 | * 10/1998 | Sauer et al. ...................... | 312/223.2 |
| 5,921,644 | * 7/1999 | Brunel et al. .................... | 312/223.2 |
| 6,025,987 | * 2/2000 | Allirot et al. .................... | 361/685 |
| 6,094,342 | * 7/2000 | Dague et al. ..................... | 361/685 |
| 6,147,862 | * 11/2000 | Ho .................................... | 361/685 |

FOREIGN PATENT DOCUMENTS

| | | | | |
|---|---|---|---|---|
| 4033833 | * | 4/1992 | (DE) ............................ | G06F/1/16 |
| 5-81845 | * | 4/1993 | (JP) ............................ | G11B/33/12 |

OTHER PUBLICATIONS

IBM Technical Disclosure Bullitin, NN87,013,692 Jan. 1987, US.*

* cited by examiner

Primary Examiner—Leo P. Picard
Assistant Examiner—Anatoly Vortman
(74) Attorney, Agent, or Firm—Wei Te Chung

(57) ABSTRACT

A circuit board support for mounting a circuit board in an enclosure includes upper and lower rails respectively mounted to top and bottom sides of the enclosure. Each rail defines a plurality of guiding slots. A support panel to which the circuit board is attached forms projections on top and bottom edges thereof for being movably received and guided by the guiding slots of the rails. A locking member is fixed to each rail and has a resilient front section defining a locking hole. The resilient section partially overlaps the support panel whereby when the support panel is moved with respect to the rails by having the projections moving along and guided by the guiding slots to a predetermined position, the locking hole is brought into engagement with a corresponding pin formed on the support panel by elastically deforming the resilient section of the locking member. The resiliency of the resilient section securely maintains the engagement between the locking hole and the pin while allowing quick and ready disengagement of the locking member from the pin for removing the support panel.

12 Claims, 6 Drawing Sheets

CIRCUIT BOARD SUPPORT

BACKGROUND OF THE INVENTION

1. Field of the Invention

The present invention generally relates to a device for supporting a circuit board, and in particular to a device for releasably supporting a main board in a computer enclosure.

2. The Prior Art

A computer enclosure comprises a chassis in which a main board support panel is fixed. Conventionally, the support panel is fixed to the chassis by bolts that complicates the assembly operation of the computer. Removable support panels are also available in the market for overcoming the above problem. An example is disclosed in Taiwan Patent Application No. 84201628 in which spring-based locking devices are used to secure the support panel. Such spring-based locking devices have a complicated structure and thus high costs. Another example is disclosed in Taiwan Patent Application No. 84214655 in which V-shaped resilient members are used to secure the support panel. The V-shaped members, however, are structurally weak and incapable to soundly secure the support panel.

Taiwan Patent Application Nos. 85200273 and 86209311 disclose circuit board support devices movably mounted to and supported by rails formed in a computer enclosure. The rails suffer from mechanical tolerance that causes the support device not to be firmly secured or incapability to be used with different designs of computer enclosures.

It is thus desired to provide a circuit board support that overcomes the above problems.

SUMMARY OF THE INVENTION

Accordingly, an object of the present invention is to provide a circuit board support for removably mounting a computer main board in a computer enclosure;

Another object of the present invention is to provide a circuit board support for readily and efficiently mounting a circuit board in an enclosure.

A further object of the present invention is to provide a circuit board support, which is secured by means of spring elements for enhancing the operation thereof.

A further objection of the present invention is to provide a circuit board support having a simple structure.

To achieve the above objects, a circuit board support in accordance with the present invention comprises upper and lower rails respectively mounted to top and bottom sides of a computer enclosure. Each rail defines a plurality of guiding slots. A support panel to which a circuit board is attached forms projections on top and bottom edges thereof for being movably received and guided by the guiding slots of the rails. A locking member is fixed to each rail and has a resilient front section defining a locking hole. The resilient section partially overlaps the support panel whereby when the support panel is moved with respect to the rails by having the projections moving along and guided by the guiding slots to a predetermined position, the locking hole is brought into engagement with a corresponding pin formed on the support panel by elastically deforming the resilient section of the locking member. The resiliency of the resilient section securely maintains the engagement between the locking hole and the pin while allowing quick and ready disengagement of the locking member from the pin for removing the support panel.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
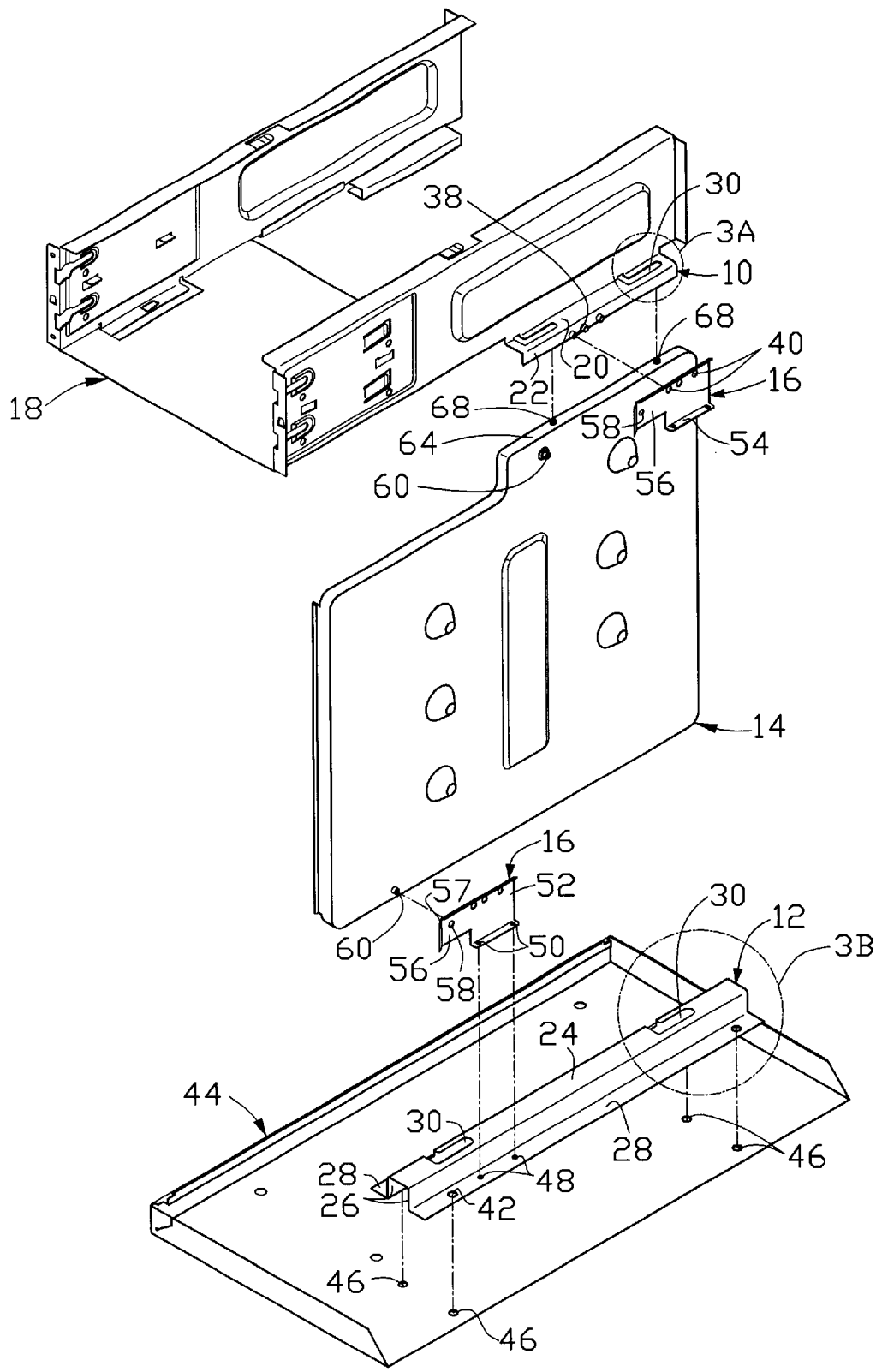
FIG. 1 is an exploded view of a circuit board support constructed in accordance with the present invention for mounting a computer main board between a disk drive rack and a bottom panel of a computer enclosure.
Figure 2:
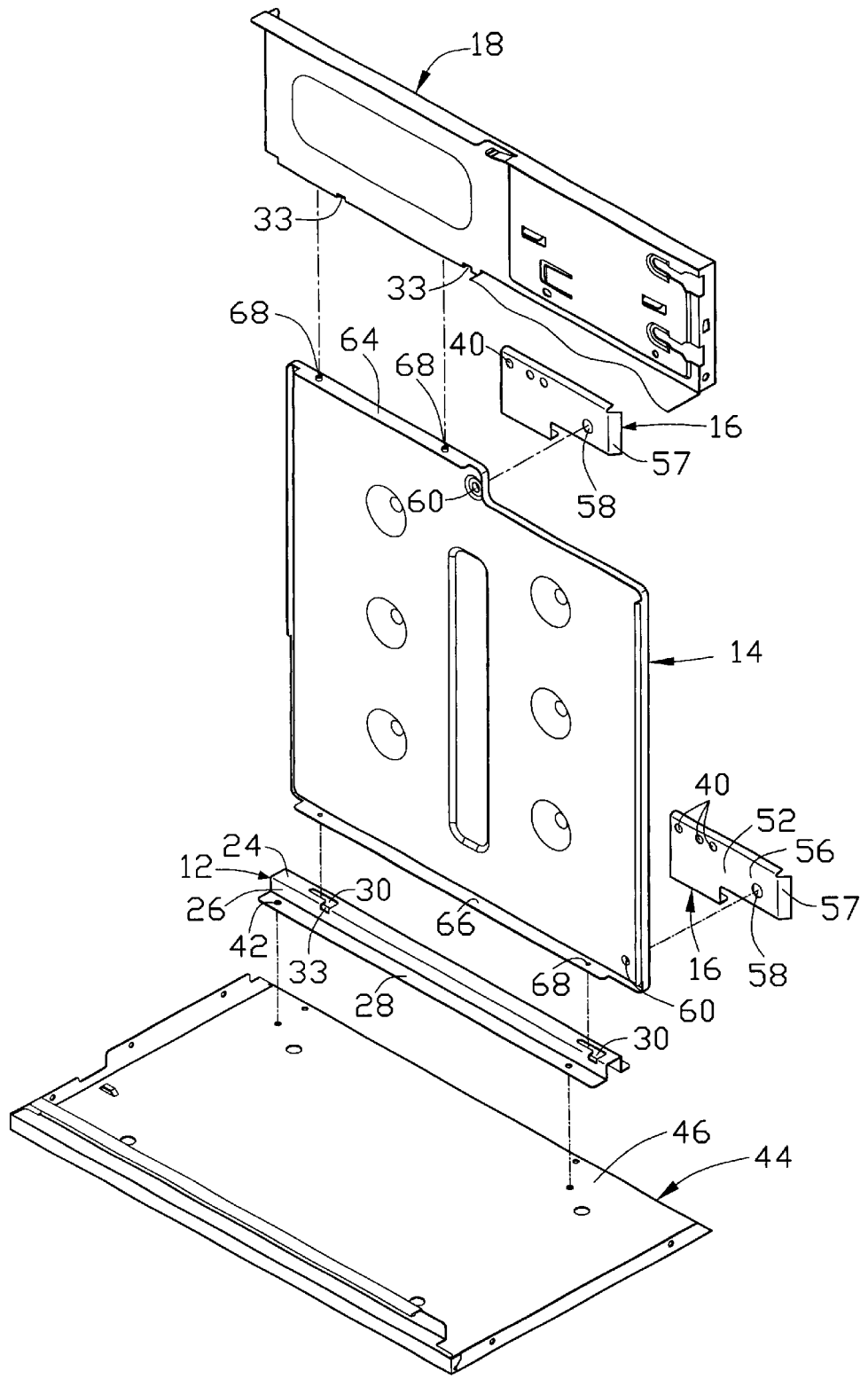
FIG. 2 is another exploded view taken at different perspective.
Figure 6:
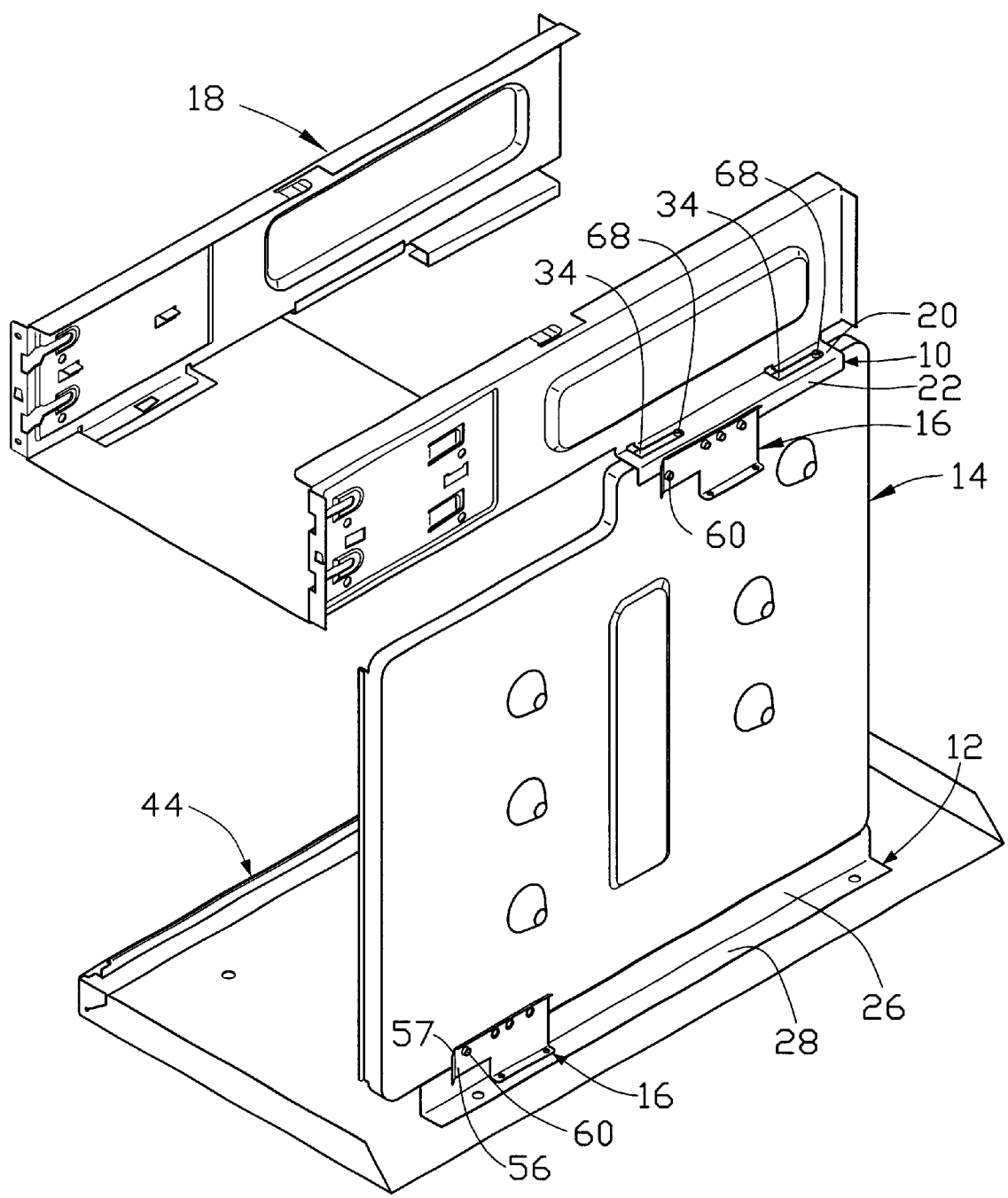
FIG. 6 is similar to FIG. 5 but showing a second phase of the process.

Referring to the drawings and in particular to FIGS. 1 and 2, a circuit board support constructed in accordance with the present invention is adapted to be mounted to a bottom panel 44 of a computer enclosure and a disk drive rack 18 positioned above the bottom panel 44 for supporting and retaining a main board (not shown) therebetween in a vertical direction as shown in FIG. 6. The circuit board support of the present invention comprises upper and lower rails 10, 12 respectively mounted to the disk drive rack 18 and the bottom panel 44 and a support panel 14 releasably attached to the upper and lower rails 10, 12 for supporting the main board therebetween.

Figure 3A:
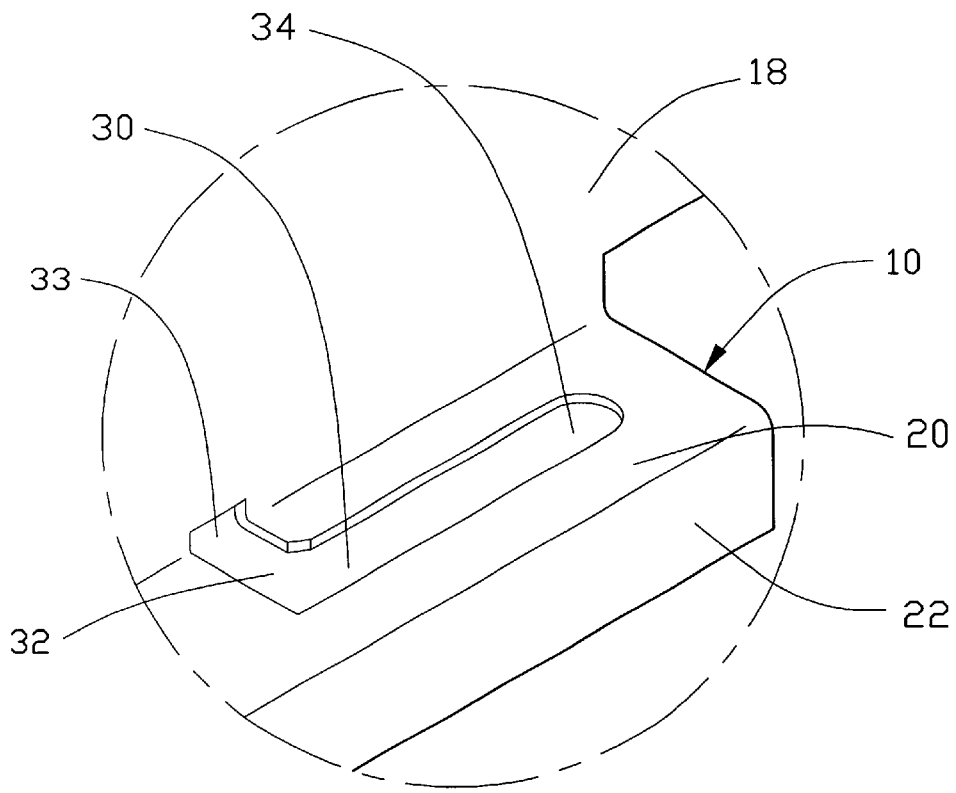
FIG. 3A is an enlarged view of encircled portion 3A of FIG. 1.

Also referring to FIG. 3A, the upper rail 10 comprises an elongate horizontal plate 20 perpendicularly extending from a side wall of the disk drive rack 18 and a perpendicular side flange 22 extending from a free edge of the elongate plate 20. A plurality of slots 30 are defined in the elongate plate 20 of the upper rail 10, each comprising an entry section 32 and a guiding section 34. In the embodiment illustrated, the entry section 32 extends in a direction substantially normal to the support panel 14 and the guiding section 34 extends in a direction substantially parallel to the support panel 14 whereby the entry section 32 is substantially normal to the guiding section 34. The entry section 32 forms an inlet opening 33.

Figure 3B:
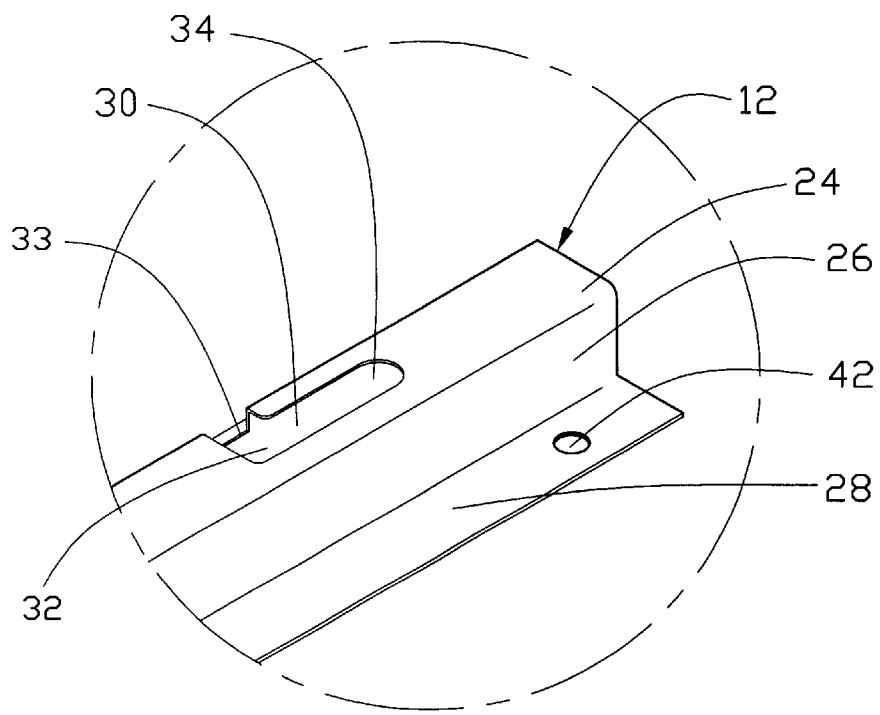
FIG. 3B is an enlarged view of encircled portion 3B of FIG. 1.

Also referring to FIG. 3B, similar to the upper rail 10, the lower rail 12 comprises an elongate horizontal plate 24 supported above the bottom panel 44 by opposite side plates 26 extending therefrom. Each side plate 26 forms a side flange 28 positioned on and fixed to the bottom panel 44 by means of fasteners (not shown) extending through holes 42, 46 defined in the flanges 28 and the bottom panel 44. A plurality of slots 30 comprising an entry section 32 and a guiding section 34 are also defined in the elongate plate 24.

The support panel 14 has top and bottom edge flanges 64, 66 on which projections 68 are formed for being movably received in the corresponding slots 30 defined in the upper and lower rails 10, 12 whereby the support panel 14 is movable with respect to the rails 10, 12 toward a predetermined locked position. The projections 68 are inserted into the corresponding slots 30 via inlet openings 33 thereof and are then moved along the entry sections 32 in a first direction substantially normal to the support panel 14. Thereafter, the projections 68 are moved along the guiding sections 34 to the locked position in a second direction substantially parallel to the support panel 14.

Figure 4:
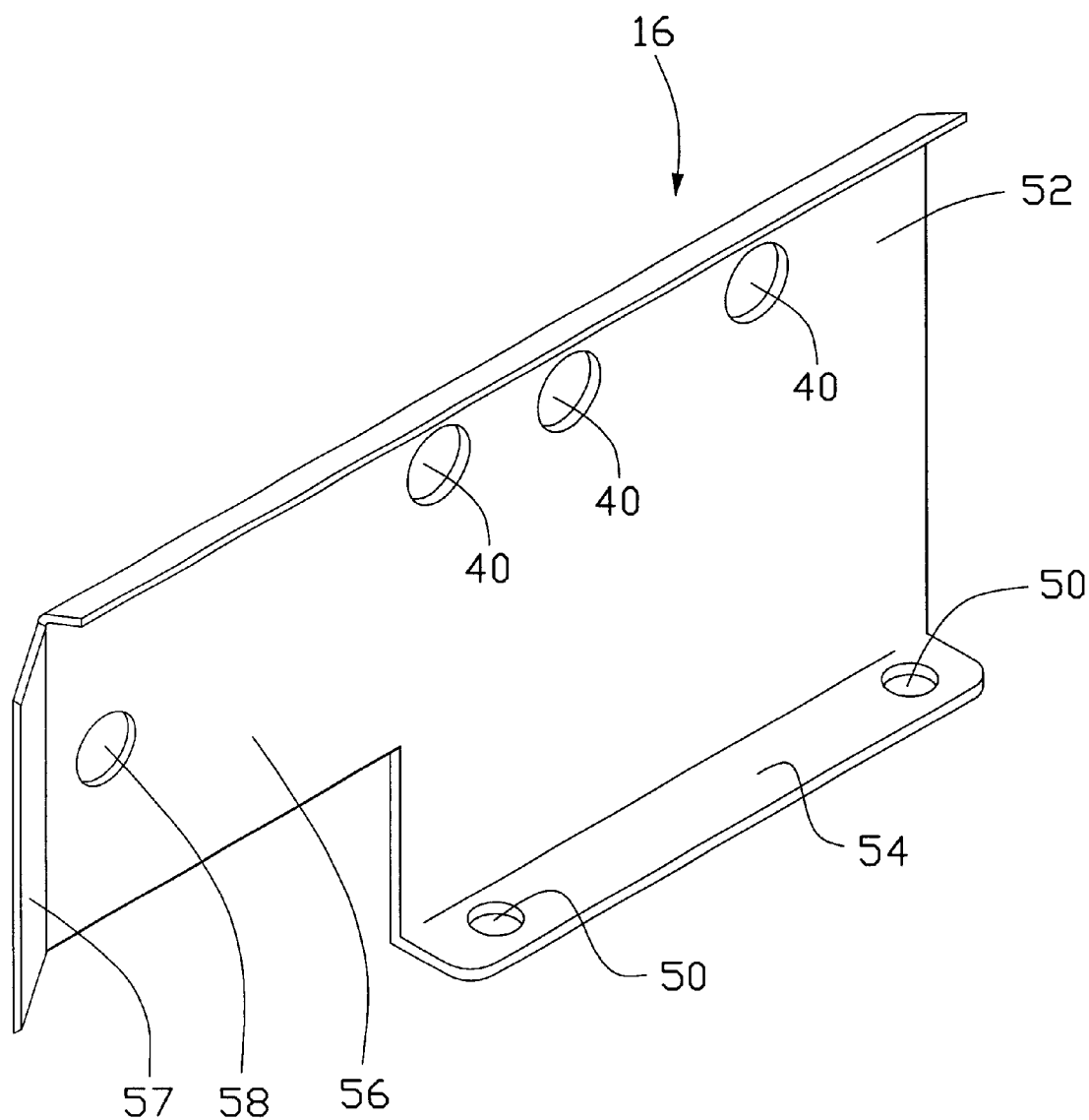
FIG. 4 is a perspective view of a locking member of the circuit board support of the present invention.

Also referring to FIG. 4, a locking member 16 is fixed to each rail 10, 12 and comprises a portion movably overlapping the support panel 14. Each locking member 16 forms a resilient front section 56 defining a locking hole 58 corresponding to a pin 60 formed on the support panel 14. The movement of the support panel 14 along the guiding sections 34 of the slots 30 of the rails 10, 12 drives the front section 56 toward the corresponding pin 60 and then elastically deforms the front section 56 for receiving the pin 60 in the locking hole 58. The resiliency of the resilient board 16 securely retains the pin 60 in the locking hole 58 thereby ensuring the engagement between hole 58 and the pin 60 for fixing the support panel 14 at the locked position. An inclination section 57 is formed in a front edge of the resilient section 56 for facilitating deformation thereof in engaging the hole 58 with the pin 60.

Each locking member 16 defines a plurality of holes 40 proximate an upper edge thereof for selectively engaging with fasteners 38 formed on the perpendicular flange 22 of the upper rail 10 thereby securing the locking member 16 to the upper rail 10. Each locking member 16 also forms a lower flange 54 in which holes 50 are defined for receiving fasteners extending through holes 48 defined in the corresponding side flange 28 of the lower rail 24 thereby securing the locking member 16 to the lower rail 12.

Figure 5:
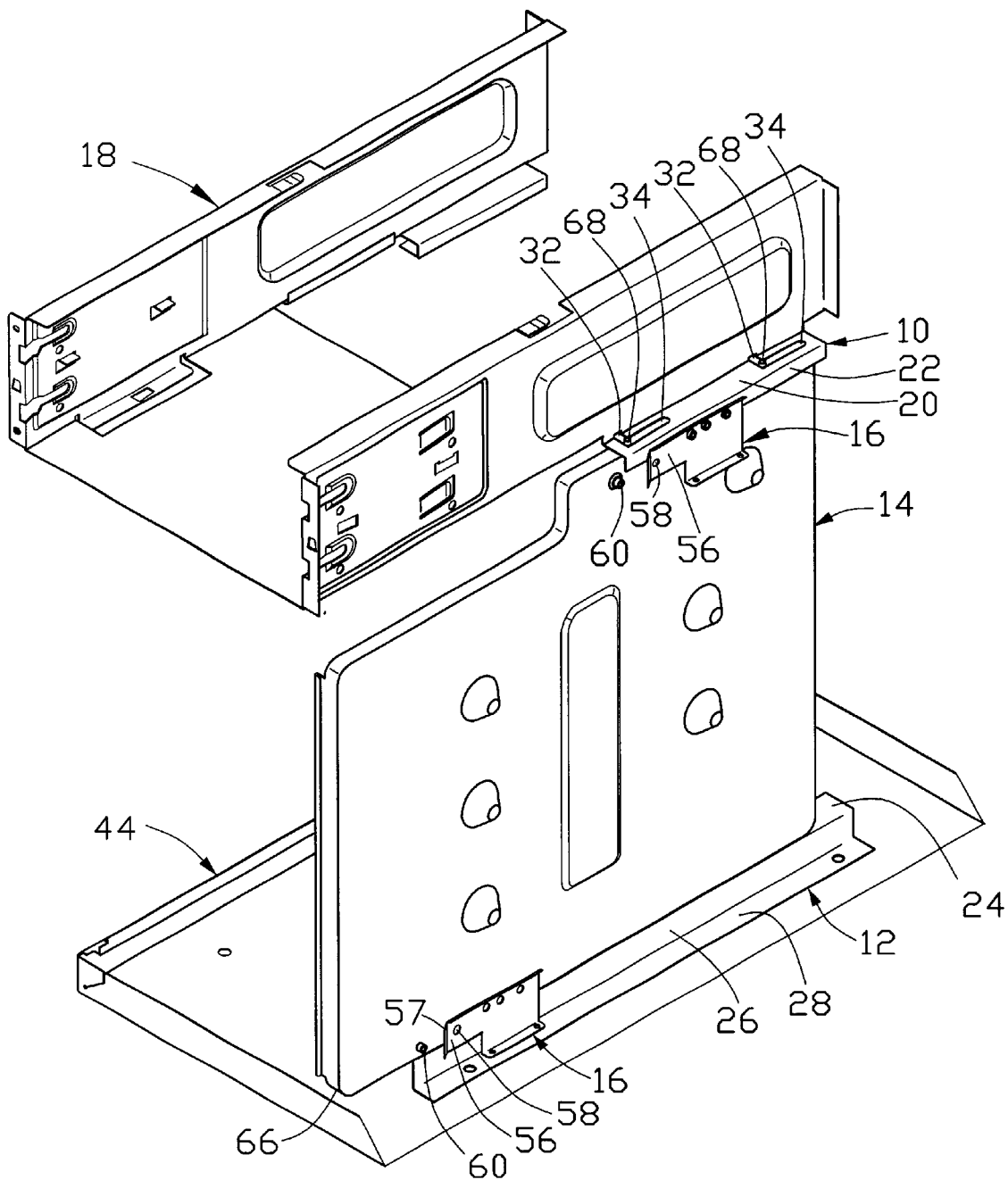
FIG. 5 is a perspective view showing a first phase of a process for mounting the main board to the computer enclosure.

FIG. 5 shows a first phase of the process for securing the support panel 14 to the upper and lower rails 10, 12. The projections 68 of the support panel 14 are received in the entry sections 32 of the slots 30 defined in the upper and lower rails 10, 12 while the locking holes 58 of the locking members 16 that are mounted to the upper and lower rails 10, 12 are separated from and thus not engaging with the pins 60 of the support panel 14.

FIG. 6 shows a second phase of the process. The support panel 14 is moved with respect to the upper and lower rails 10, 12 by having the projections 68 thereof moving along and guided by the guiding sections 34 of the slots 30 of the upper and lower rails 10, 12 to the predetermined locked position where the locking holes 58 engage with the corresponding pins 60 thereby fixing the support panel 14 to the upper and lower rails 10, 12.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A circuit board support adapted to mount a circuit board in an enclosure comprising:
   a support panel to which the circuit board is attached, the support panel having top and bottom edges with projections formed thereon and forming at least one pin;
   upper and lower rails respectively mounted to top and bottom sides of the enclosure, each rail defining a plurality of slots for movably receiving the projections of the top and bottom edges of the support panel; and
   a locking member fixed to at least one of the rail, the locking member having a resilient section in which a hole is defined whereby when the support panel is moved with respect to the rails to a predetermined locked position, the hole engages with a pin formed on the support panel by elastically deforming the resilient section thereby fixing the support panel at the locked position, the engagement being ensured by the resiliency of the resilient section.

2. The circuit board support as claimed in claim 1, wherein each slot of the rails comprises an entry section extending in a direction substantially normal to the support panel for reception of the corresponding projection and a guiding section extending in a direction substantially parallel to the support panel for guiding the movement of the support panel toward the locked position.

3. The circuit board support as claimed in claim 2, wherein the entry section of each slot of the rails forms an inlet opening for receiving the corresponding projection.

4. The circuit board support as claimed in claim 1, wherein the upper rail comprises an elongate plate perpendicularly extending from an internal wall of the enclosure with the slots defined therein.

5. The circuit board support as claimed in claim 4, wherein the upper rail further comprises a side flange substantially perpendicularly extending from the elongate plate with the locking member fixed thereto.

6. The circuit board support claimed in claim 1, wherein the lower rail comprises an elongate plate supported above and fixed to a bottom panel of the enclosure with the slots defined therein.

7. The circuit board support as claimed in claim 6, wherein the lower rail further comprises two side plates extending from the elongated plate and side flanges extending from side plates for being positioned on and fixed to the bottom panel, the locking member being attached to one of the side flanges.

8. The circuit board support as claimed in claim 1, wherein the resilient section of the locking member comprises an inclined section for guiding the pin into engagement with the hole thereof.

9. The circuit board support as claimed in claim 1 comprising two locking members respectively fixed to the rails.

10. A device for releasably fixing a support member that supports a circuit board to an enclosure comprising:
    at least a slot defined in an internal wall of the enclosure for receiving a corresponding projection formed on the support member for guiding movement of the support member with respect to the enclosure toward a predetermined locked position;
    a locking member fixed to the enclosure and having a resilient section movably overlapping the support member, a hole being defined in the resilient section for engaging with a pin extending from the support member when the support member is moved to the locked position thereby securing the support member at the locked position.

11. A computer enclosure comprising:
    a chassis having a bottom panel, on which a lower rail is formed, slots being defined in the lower rail;
    a disk drive rack fixed to the chassis at a position above the bottom panel, an upper rail being formed on the disk drive rack, slots being defined in the upper rail;
    a support panel to which a main board is attached, the support panel having top and bottom edges on which projections are formed for being movably received in the corresponding slots of the upper and lower rails whereby the support panel is moveable with respect to the rails toward a predetermined locked position, a pin being formed on the support panel associated with each rail;

a locking member fixed to each of the rails, each locking member having a resilient section in which a hole is defined for engaging with the corresponding pin of the support panel by elastically deforming the resilient section when the support panel is moved to the locked position, the resiliency of the resilient section ensuring the engagement between the pin and the hole.

12. A computer enclosure assembly comprising:

a chassis including upper and lower rails respectively mounted to upper and bottom sides of the chassis, said upper rail and said lower rail defining slots opposite to each other in a vertical direction, each of said slots defining an L-shaped configuration with an entry section forming an inlet opening therein;

a support panel to which a printed circuit board is attached, said support panel defining top and bottom edges with therebetween a vertical dimension in compliance with a distance between said upper and lower rails, projections being formed on said top and bottom edges, respectively; and locking means provided adjacent to said upper and lower rails; whereby the support panel is loaded between said upper and lower rails, in a lateral direction, with projections respectively entering the corresponding slots from the inlets thereof, and further moved along the corresponding slots in a front-to-back direction under the condition of the top and bottom edges respectively abutting against the corresponding upper and lower rails, until the locking means latchably engages corresponding portions of the support panel for preventing backward movement of the support panel with regard to the upper and lower rails along said front-to-back direction.

* * * * *